(12) United States Patent
Yamazawa

(10) Patent No.: US 7,915,900 B2
(45) Date of Patent: Mar. 29, 2011

(54) MEASURING SYSTEM

(75) Inventor: Yohei Yamazawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 450 days.

(21) Appl. No.: 12/055,689

(22) Filed: Mar. 26, 2008

(65) Prior Publication Data

US 2008/0238440 A1    Oct. 2, 2008

Related U.S. Application Data

(60) Provisional application No. 60/945,956, filed on Jun. 25, 2007.

(30) Foreign Application Priority Data

Mar. 30, 2007    (JP) .................................. 2007-091144

(51) Int. Cl.
*G01R 27/00* (2006.01)
*H01J 7/24* (2006.01)

(52) U.S. Cl. .................................. 324/600; 315/111.21

(58) Field of Classification Search .................. 324/600, 324/76.11; 702/57, 65; 315/111.21, 111.01, 315/111.31, 111.41, 111.81, 111.91
See application file for complete search history.

(56) References Cited

U.S. PATENT DOCUMENTS

| | | | | |
|---|---|---|---|---|
| 6,538,388 B2 * | 3/2003 | Nakano et al. | ........... | 315/111.21 |
| 6,876,935 B2 | 4/2005 | Kamitani | | |
| 7,019,543 B2 * | 3/2006 | Quon | ............................ | 324/713 |
| 7,120,556 B2 * | 10/2006 | Nakano et al. | ................ | 702/182 |
| 7,137,352 B2 * | 11/2006 | Yamashita et al. | ........ | 118/723 E |
| 2006/0037704 A1 * | 2/2006 | Iwata et al. | .............. | 156/345.48 |

FOREIGN PATENT DOCUMENTS

JP    2004-226105    8/2004

* cited by examiner

*Primary Examiner* — Hoai-An D Nguyen
(74) *Attorney, Agent, or Firm* — Oblon, Spivak, McClelland, Maier & Neustadt, L.L.P.

(57) ABSTRACT

A measuring system measuring an impedance of an object to be measured, including an impedance measuring instrument; a casing formed of a grounded conductor and capable of locating the object to be measured therein; and a radially-shaped electrode connected to the impedance measuring instrument and capable of being connected to the object to be measured.

6 Claims, 9 Drawing Sheets

MEASURING SYSTEM

BACKGROUND OF THE INVENTION

1. Field of the Invention

The present invention relates to a measuring system measuring an impedance of an object to be measured using an impedance measuring instrument to measure various physical properties such as dielectric loss tangent and resistivity and so on for the object to be measured.

2. Description of the Related Art

In recent years, a chamber and the like for use in substrate processing such as etching, deposition and so on when manufacturing a semiconductor processing apparatus, a liquid crystal display device, and so on become more sophisticated. With the sophistication, the performance required for parts such as a chamber and the like for substrate processing is getting higher. Therefore, when measuring the physical properties of parts such as a chamber and the like, a high measuring accuracy is required.

Japanese Patent Application Laid-open No. 2004-226105 discloses a measuring technique of measuring the impedance of an object to be measured using an impedance measuring instrument such as an impedance analyzer, a network analyzer, or the like.

SUMMARY OF THE INVENTION

The impedance measuring instrument measures the impedance by bringing an electrode into contact with an object to be measured. Generally, the size of the electrode connected to the object to be measured from the impedance measuring instrument is large, and therefore the electrode functions as an antenna, so that when measuring the impedance of the object to be measured, the impedance is greatly influenced, for example, by metals, observer and so on existing around it. Thus, noise is mixed into the value of the measured impedance, making it difficult to accurately measure the impedance of the object to be measured.

The present invention has been developed in consideration of the above problem and its object is to provide a measuring technique capable of preventing mixture of noise due to influence by surroundings of an object to be measured to measure the impedance of the object to be measured with a high accuracy.

To solve the above problem, the present invention provides a measuring system measuring an impedance of an object to be measured, including: an impedance measuring instrument; a casing formed of a grounded conductor and capable of locating the object to be measured therein; and a radially-shaped electrode connected to the impedance measuring instrument and capable of being connected to the object to be measured.

In the above-described measuring system, the object to be measured may be a chamber internal part composed of an insulator in a semiconductor processing apparatus.

In the above-described measuring system, the object to be measured may be a conductor covered by a dielectric in a semiconductor processing apparatus.

Further, the present invention provides a measuring system measuring an impedance of an object to be measured, including: an impedance measuring instrument; a casing formed of a grounded conductor and capable of locating the object to be measured therein; a plurality of electrodes connected to the impedance measuring instrument and capable of being connected to the object to be measured; and a switch capable of switching such that only selected electrodes of the plurality of electrodes are connected to the impedance measuring instrument.

In the above-described measuring system, the object to be measured may be a conductor covered by a dielectric in a semiconductor processing apparatus.

Further, the present invention provides a measuring system measuring an impedance of an object to be measured, including: an impedance measuring instrument; and a first and a second electrode connected to the impedance measuring instrument and capable of being connected to the object to be measured, the second electrode being configured in an annular shape to cover the first electrode.

According to the present invention, the electrodes connected to the impedance measuring instrument can be protected from electromagnetic disturbance around the object to be measured, so that the impedance of the object to be measured can be accurately measured. This makes it possible to accurately obtain various physical properties of the object to be measured from the measured impedance.

DETAILED DESCRIPTION OF THE INVENTION

Hereinafter, preferred embodiments of the present invention will be described with reference to the drawings. Note that in this specification and the drawings, the same symbols and numbers are given to components having substantially the same functions and thereby duplicated description thereof will be omitted.

Figure 1:
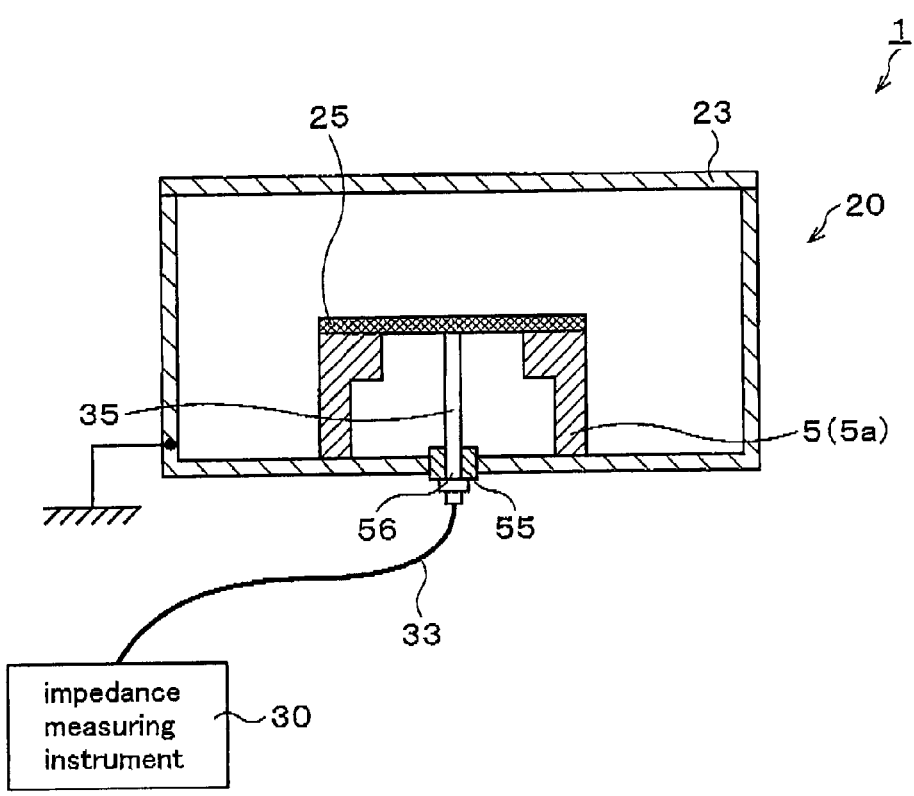
FIG. 1 is a configuration diagram of a measuring system 1 according to a first embodiment of the present invention.

FIG. 1 is a configuration diagram of a measuring system 1 according to a first embodiment of the present invention. In the first embodiment of the present invention, the impedance of a chamber internal part 5a as an object to be measured is measured, and the value of dielectric loss tangent that is one of physical properties of the object to be measured 5 is calculated from the value of the measured impedance. The chamber internal part 5a used in the first embodiment of the present invention is an insulating body (generally called an insulator or the like) in an almost cylindrical shape used in a chamber 10 of a substrate processing apparatus 9 for etching and deposition when manufacturing a semiconductor or the like whose one example is shown in FIG. 2.

Figure 2:
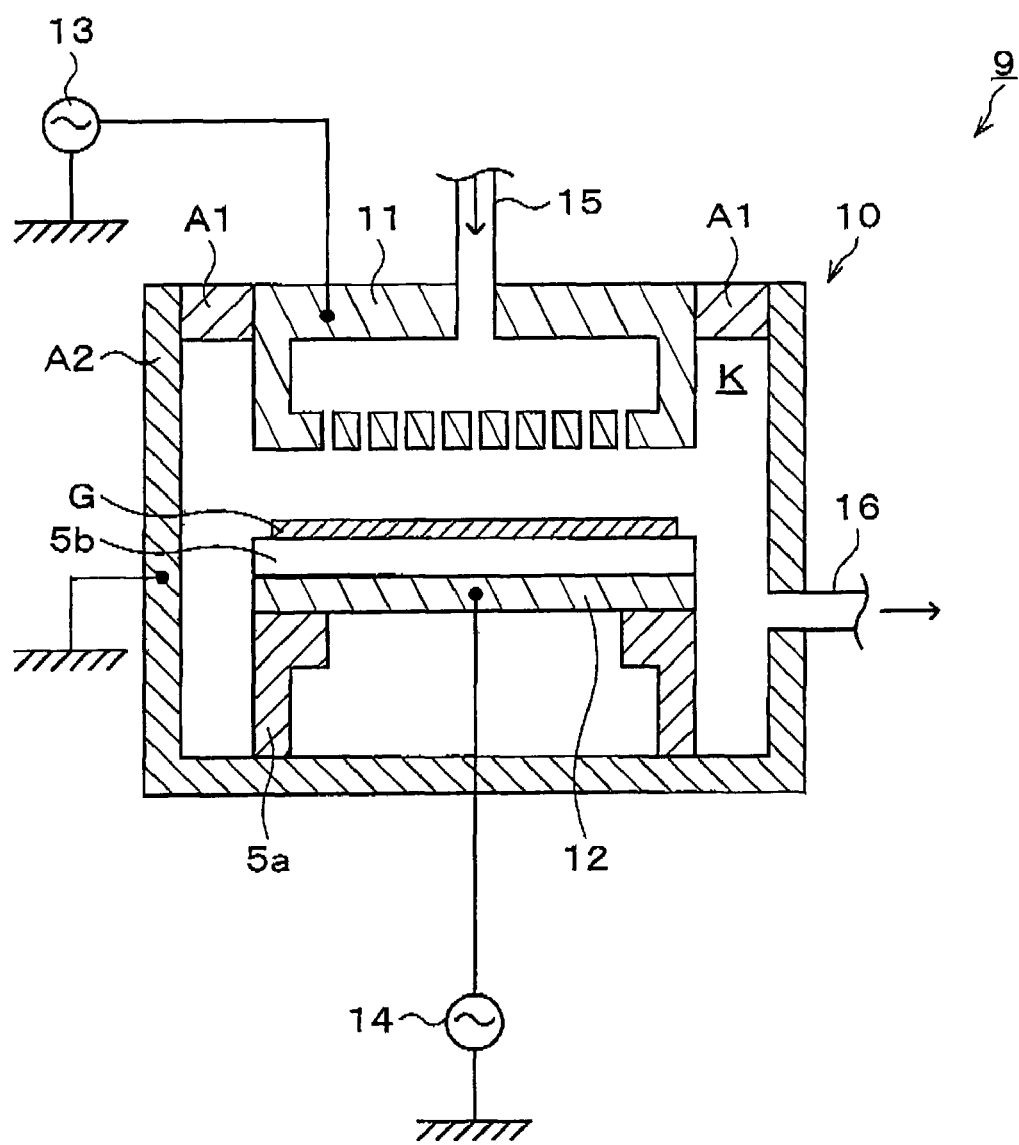
FIG. 2 is an explanatory view explaining a chamber internal part 5a whose impedance is measured as an object to be measured 5 in the measuring system 1 according to the first embodiment of the present invention.

The substrate processing apparatus 9 shown in FIG. 2 will be briefly described. The substrate processing apparatus 9 is for performing processing such as etching and the like on a substrate W in a semiconductor manufacturing process. Inside the chamber 10, a processing space K is formed. A wall portion A2 of the chamber 10 is grounded. In the chamber 10, an upper electrode 11 and a lower electrode 12 are oppositely arranged to which radio frequency is applied. To the upper electrode 11, a radio frequency power, for example, at a frequency of 60 MHz for generating plasma is supplied from a radio frequency power supply 13, so that the processing gas in the processing space K can be made plasma to perform processing on the substrate W. On the other hand, to the lower electrode 12, a radio frequency power at a frequency of 13 MHz is supplied from a radio frequency power supply 14 in order to adjust the energy spread of ions incident on the substrate W. The upper electrode 11 and the lower electrode 12 are in an almost disc shape and made of a conductive material. Between the upper electrode 11 and the wall portion A2, an insulating body A1 is located. An electrostatic chuck 5b that electrostatically adsorbs and fixes the substrate W thereto is provided on the lower electrode 12, and the almost cylindrical insulator 5a made of an insulating body is provided under the lower electrode 12. Into the processing space K, the processing gas is supplied through a gas supply path 15 and the upper electrode 11 having a functioning as a shower head. Further, the processing gas in the processing space K is exhausted through a gas exhaust path 16. Note that though the object to be measured 5 is described taking the substrate processing apparatus 9 shown in FIG. 2 as an example in this case, it may be a chamber internal part of a substrate processing apparatus other than the substrate processing apparatus 9 shown in FIG. 2 or may be a part other than the chamber internal part.

As shown in FIG. 1, the measuring system 1 is configured to measure the impedance by locating the object to be measured 5 in a closed space formed inside a casing 20 being a grounded hollow conductor in a column shape. In the first embodiment of the present invention, the almost cylindrical object to be measured 5 is placed at a center of the bottom surface inside the casing 20 with its axial direction being parallel to the vertical direction. On the object to be measured 5, an electrode 25 in an almost disc shape is mounted. The electrode 25 is placed in contact only with the object to be measured 5 but not with the inner surface of the casing 20. The electrode 25 is connected to an impedance measuring instrument 30 via a conductive wire 33 and a power supply rod 35. The measuring system 1 supplies a radio frequency power from the impedance measuring instrument 30 to the electrode 25 in contact with the object to be measured 5 to obtain its reflection coefficient to thereby measure the impedance of the object to be measured 5.

As shown in FIG. 1, the upper surface of the casing 20 is a detachable lid body 23. This allows an operation such that the lid body 23 is detached from the casing 20 so as to locate, for example, the object to be measured 5 inside the casing 20, to take the object to be measured 5 out of the inside of the casing 20, and so on.

Figure 3:
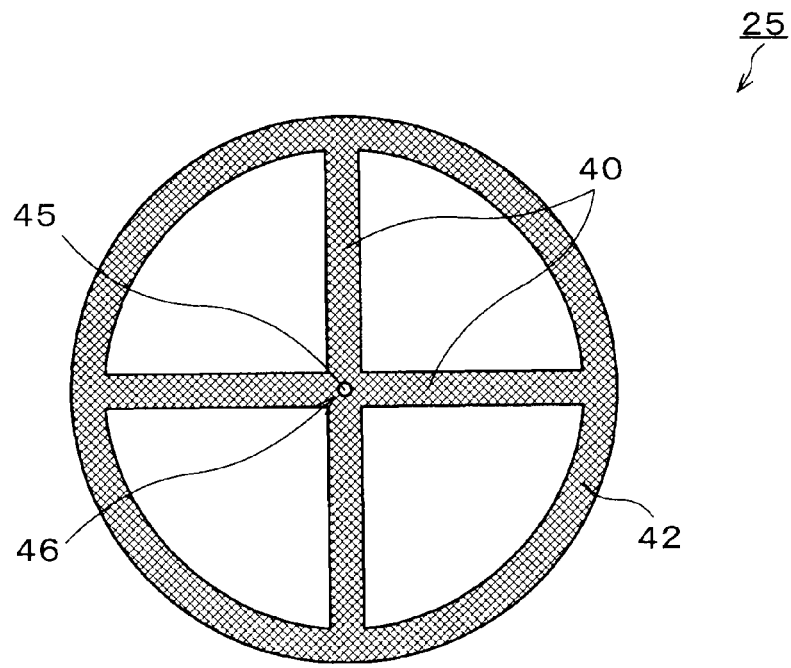
FIG. 3 is a plan view of an electrode 25 located on the object to be measured 5 used in the first embodiment of the present invention.

FIG. 3 is a plan view of the electrode 25 located on the object to be measured 5 for use in the first embodiment of the present invention. In the first embodiment of the present invention, the almost disc-shaped electrode 25 is concentrically located on the almost cylindrical object to be measured 5 (5a). As shown in FIG. 3, the electrode 25 includes four spoke electrodes 40 which radially extend outward from a central position ◯ within the same plane (the paper surface shown in FIG. 3). These four spoke electrodes 40 have the same length in a longitudinal direction, and any of angles formed between adjacent spoke electrodes 40 is 90 degrees.

Respective one ends of the four spoke electrodes 40 are coupled to one another at the center position ◯, and respective other ends are connected to an annular outer peripheral electrode 42. The width of the spoke electrode 40 (i.e. the length in the width direction perpendicular to the longitudinal direction) and the width in the radius direction of the outer peripheral electrode 42 are set to about 10 mm to about 20 mm. Note that the electrode 25 may have any number of spoke electrodes 40. Though the center angle formed between the adjacent spoke electrodes 40 may be arbitrary, the spoke electrodes 40 are preferably symmetrically arranged such that a circle is evenly divided by each of the spoke electrodes 40. Alternatively, the electrode 25 may be configured to have only the spoke electrodes 40 without the outer peripheral electrode 42.

At the center position ◯ of the electrode 25, a hole 45, for example, in a column shape is provided. At the inner surface of the hole 45, a screw thread T1 is provided to ensure that a coupling member 46 in an almost column shape including a screw thread T2 at its outer peripheral surface engaging with the screw thread can be fixedly screwed to the screw thread T1. This coupling member 46 is handled integrally with the electrode 25 while being fixedly screwed in the hole 45 of the electrode 25.

Figure 4:
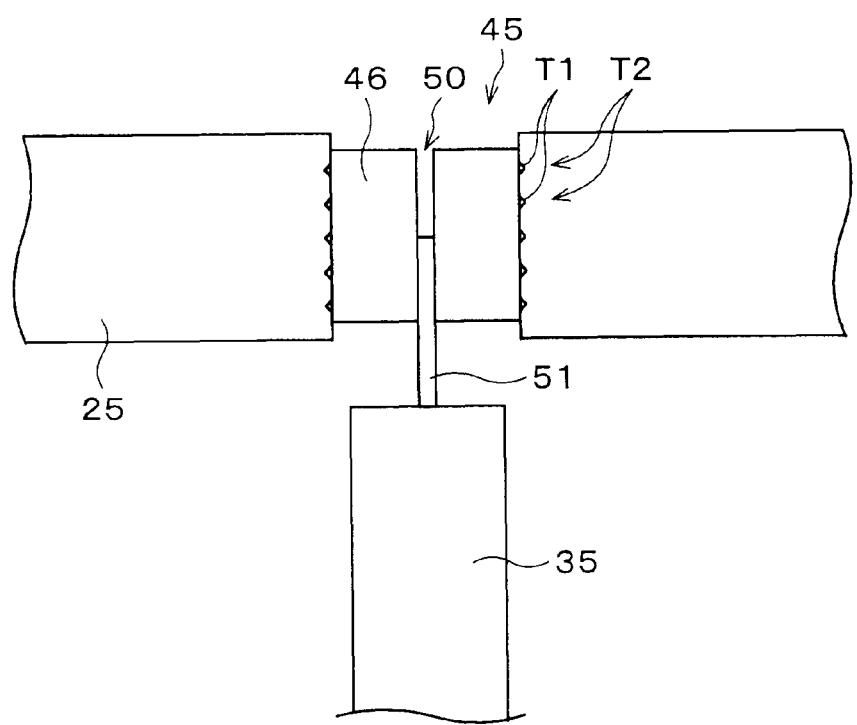
FIG. 4 is an enlarged cross-sectional view showing an enlarged cross section of a side surface of a coupling portion of the electrode 25 and a power supply rod 35 shown in FIG. 1.

FIG. 4 is an enlarged cross-sectional view showing an enlarged cross section of the side surface of a coupled portion of the electrode 25 and the power supply rod 35 shown in FIG. 1. As described above, the coupling member 46 is fixed in the hole 45 of the electrode 25, and the power supply rod 35 is coupled to the coupling member 46. As shown in FIG. 4, the coupling member 46 is provided with a slit 50 in the vertical direction, so that a tapered tip portion 51 of the power supply rod 35 can be inserted and fixed. This allows the power supply rod 35 to be fixed to the electrode 25 via the coupling member 46. Note that both of the tip portion 51 of the power supply rod 35 and the coupling member 46 are made of a conductive material, so that supply the radio frequency power supplied from the impedance measuring instrument 30 to the power supply rod 35 can be supplied from the tip portion 51 of the power supply rod 35 to the electrode 25 via the coupling member 46.

The supply rod 35 is placed passing through the central portion of the bottom surface of the casing 20 located extending on both the outside and the inside of the casing 20 as shown in FIG. 1. At a portion where the power supply rod 35 penetrates the casing 20, an insulating body 55 such as Teflon or the like is provided between the power supply rod 35 and the casing 20 to electrically insulate the power supply rod 35 and the casing 20 from each other. An end portion 56 existing on the opposite to the tip potion 51 of the power supply rod 35 is connected to the conductive wire 33 connected to the impedance measuring instrument 30 outside the casing 20.

As the impedance measuring instrument 30, an impedance analyzer that measures the impedance by applying a radio frequency power to the object to be measured 5. The impedance analyzer can obtain various physical properties of the object to be measured 5, for example, the dielectric loss tangent, the resistivity, and so on from the measured impedance. Note that as the impedance measuring instrument 30, an arbitrary measuring unit other than the impedance analyzer may be used, such as a network analyzer, LCR meter, or the like. The impedance measuring instrument 30 may be a measuring unit that measures only the impedance, and in that case, various physical properties of the object to be measured 5 are measured by another unit or a measurer based on the value of the measured impedance.

Next, a procedure of measuring the impedance of the chamber internal part 5a as one example of the object to be measured 5 using the measuring system 1 configured as described above to obtain the value of the dielectric loss tangent of the object to be measured 5 will be described using FIG. 1 to FIG. 4.

The lid body 23 of the casing 20 is detached. In the initial state, the electrode 25 has been removed from the power supply rod 35 inside the casing 20. As shown in FIG. 1, the chamber internal part 5a as the almost cylindrical object to be measured 5 (hereinafter, referred to as the object to be measured 5) is mounted on the inner bottom surface of the casing 20 such that the power supply rod 35 penetrates a hollow portion at the center along the axial direction of the object to be measured 5. After the positions of the object to be measured 5 and the electrode 25 with respect to the power supply rod 35 are appropriately adjusted, the electrode 25 is mounted on the object to be measured 5 while the tip portion 51 of the power supply rod 35 is being inserted into the slit 50 of the coupling member 46 fixed to the electrode 25. This brings the electrode 25 into connection with the impedance measuring instrument 30 via the coupling member 46, the power supply rod 35 and the conductive wire 33 as shown in FIG. 1.

The detached lid body 23 is attached to bring the inside of the casing 20 into a closed space. A radio frequency power is applied from the electrode 25 to the object to be measured 5 so that its impedance is measured using the impedance measuring instrument 30. From the value of the measured impedance, the value of dielectric loss tangent of the object to be measured 5 is obtained. Note that the dielectric loss tangent is a value indicating the dielectric loss of the object to be measured 5. To concretely explain it, when an impedance Z of the object to be measured 5 is expressed as Z=R+iX, the value of the dielectric loss tangent is (−R/X). The value of the dielectric loss tangent needs to be decreased in order to suppress the output loss of the radio frequency to be applied to the substrate in the chamber, when the object to be measured 5 is used as the chamber internal part. In the first embodiment of the present invention, the impedance measuring instrument 30 calculates the value of the dielectric loss of the object to be measured 5 based on the value of the measured impedance.

After completion of measurement, the lid body 23 of the casing 20 is detached. The electrode 25 in the casing 20 is taken out, and the object to be measured 5 is then taken out. When measurement of another object to be measured 5 is subsequently performed, the other object to be measured 5 to be measured is located in the casing 20, and the above-described procedure is repeated. Otherwise, the lid body 23 is attached to the casing 20, with which the series of measurement procedure ends.

Figure 5:
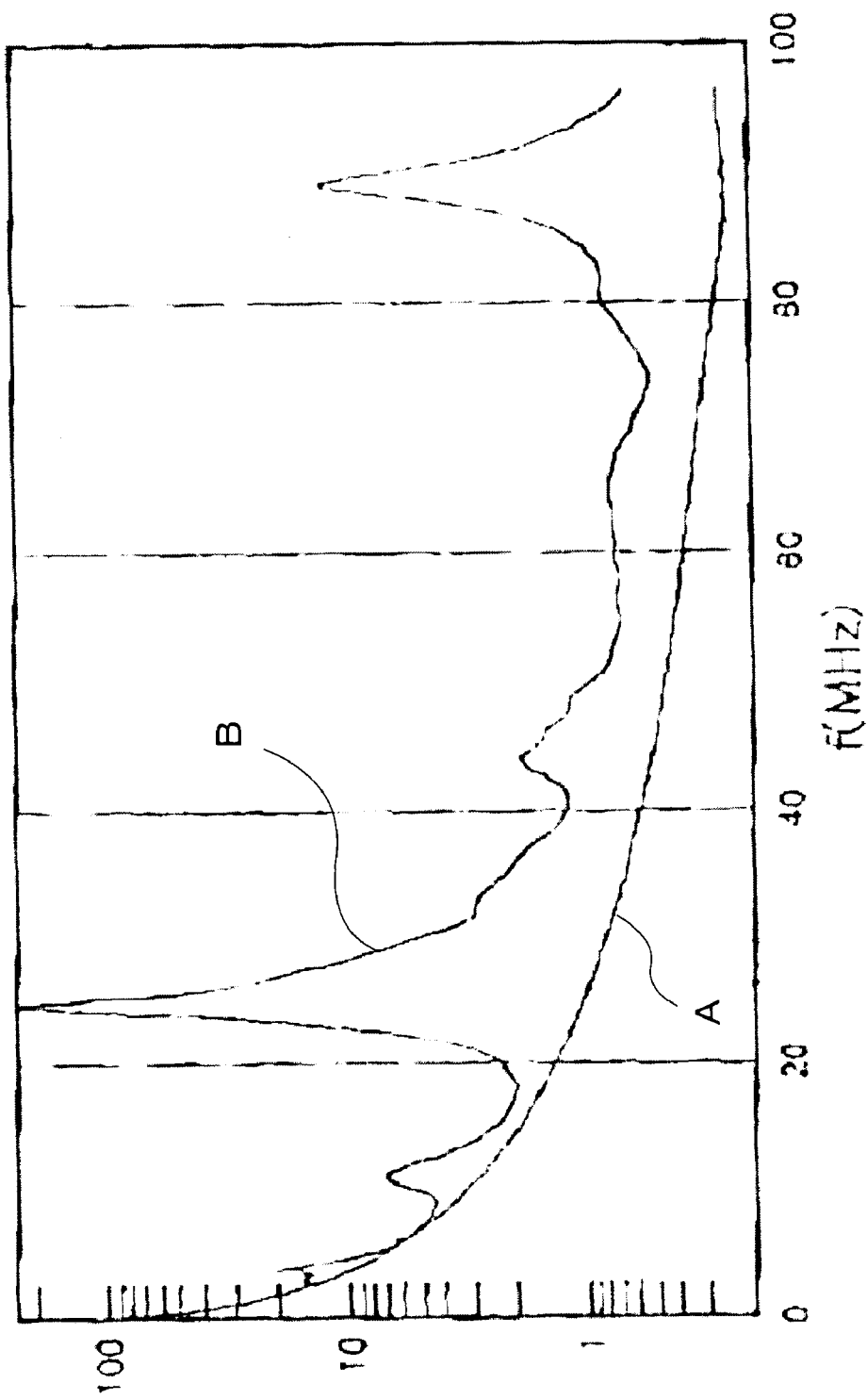
FIG. 5 is a diagram showing a measurement result measured using the measuring system 1 according to the first embodiment of the present invention in conjunction with a comparative example.

According to the above first embodiment, the object to be measured 5 is located in the casing 20 that is a conductor so that noise due to influence by surroundings of the object to be measured 5 is blocked, thereby enabling measurement of the impedance of the object to be measured 5 at a higher accuracy than that in the prior art. This ensures that various physical properties of the object to be measured 5 such as the value of the dielectric loss tangent and so on can be very accurately obtained from the measured impedance. Further, there is a component of an RF signal (a radio frequency) applied to the measuring system which flows from the electrode surface to the ground electrode without passing through a measuring object. This component increases in proportion to the electrode area. Hence, the electrode can be shaped in a radial form to decrease the electrode area and thus reduce the component flowing to the ground electrode without passing through the measuring object to thereby improve the accuracy of the measurement. An effect of the first embodiment of the present invention is now described using FIG. 5 showing a measurement result in the measuring system 1. In FIG. 5, the horizontal axis indicates the frequency of a radio frequency to be applied, and the vertical axis indicates the actual resistance component of the object to be measured 5. Further, a solid line A shows a case of measurement with the object to be measured 5 being located in the casing 20, and a solid line B shows a case of measurement of the object to be measured 5 without using the casing 20. As is clear from FIG. 5, in the data of the solid line B, a behavior like a noise is found in the data, whereas in the data of the solid line A, the noise disappears to improve the accuracy of the data.

Figure 6:
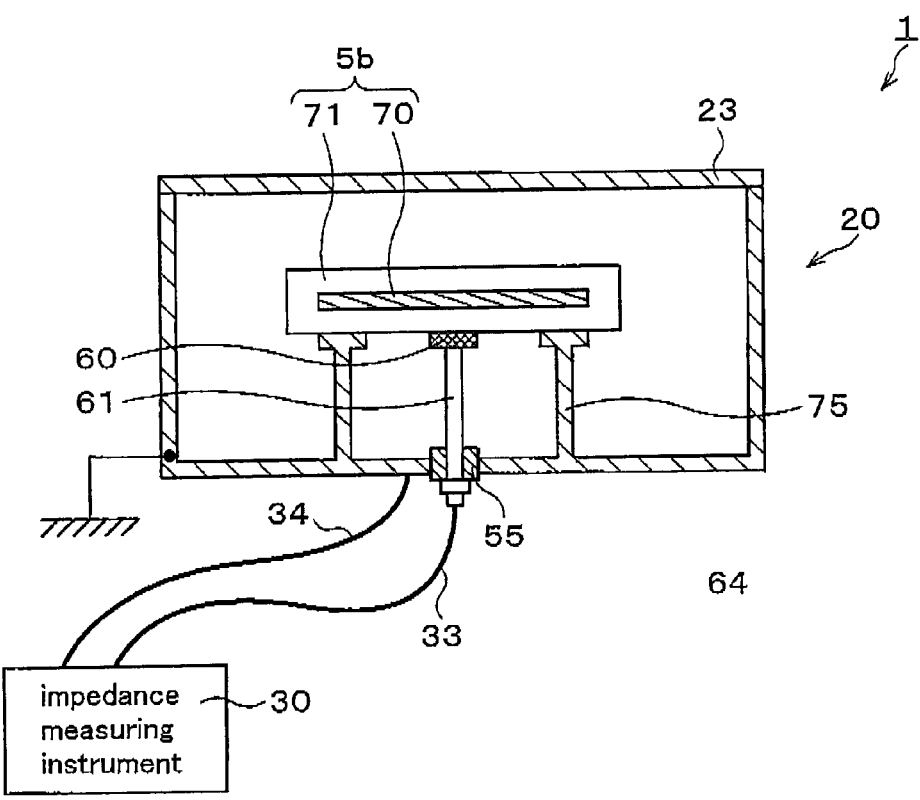
FIG. 6 is a configuration diagram of a measuring system 1 according to a second embodiment of the present invention.

As a second embodiment of the present invention, as shown in FIG. 6, the electrode 25 for use in measuring the impedance may be a first electrode 60 in contact with the central portion of the object to be measured 5. As shown in FIG. 6, the first electrode 60 is in contact with the object to be measured 5 from below. Note that the casing 20 is grounded as in FIG. 1.

In the second embodiment of the present invention, the impedance of the electrostatic chuck 5b that is one of the chamber internal parts 5 of the substrate processing apparatus 9 shown in FIG. 2, as the object to be measured 5, and its resistivity is measured from the value of the measured impedance. The electrostatic chuck 5b is a conductor 70 covered by a dielectric 71 and is formed in a disc shape as shown in FIG. 6. The electrostatic chuck 5b is supported by a support 75 that is an annular conductor provided on the inner bottom surface of the casing 20 with a surface of the electrostatic chuck 5b being horizontally kept. Note that, as in the first embodiment of the present invention, the first electrode 60 is provided on a power supply rod 61 located extending on both the outside and the inside of the casing 20 in the second embodiment of the present invention. The power supply rod 61 is connected to the conductive wire 33 connected to impedance measuring instrument 30. Further, at a portion where the power supply rod 61 penetrates the casing 20, an insulating body 55 such as Teflon or the like is provided between the power supply rod 61 and the casing 20 to electrically insulate the power supply rod 61 and the casing 20 from each other.

The electrostatic chuck 5b is a unit that electrostatically adsorbs and fixes the substrate when the substrate is processed using the substrate processing apparatus 9 shown in FIG. 2, and if the value of the resistivity of the electrostatic chuck 5b is too high, the electrostatic adsorption is weakened. Further, the substrate processing apparatus 9 usually includes a field correcting function (not shown), and if the value of the resistivity of the electrostatic chuck 5b is too low, the field correcting function does not work any longer. Therefore, the value of the resistivity of the electrostatic chuck 5b needs to accurately fall within a predetermined range. Note that though the electrostatic chuck 5b is described in this case, the forgoing also applies to another object to be measured 5 such as a embedded heater or the like configured such that the conductor 70 is covered by the dielectric 71 similarly to the electrostatic chuck 5b.

Figure 7:
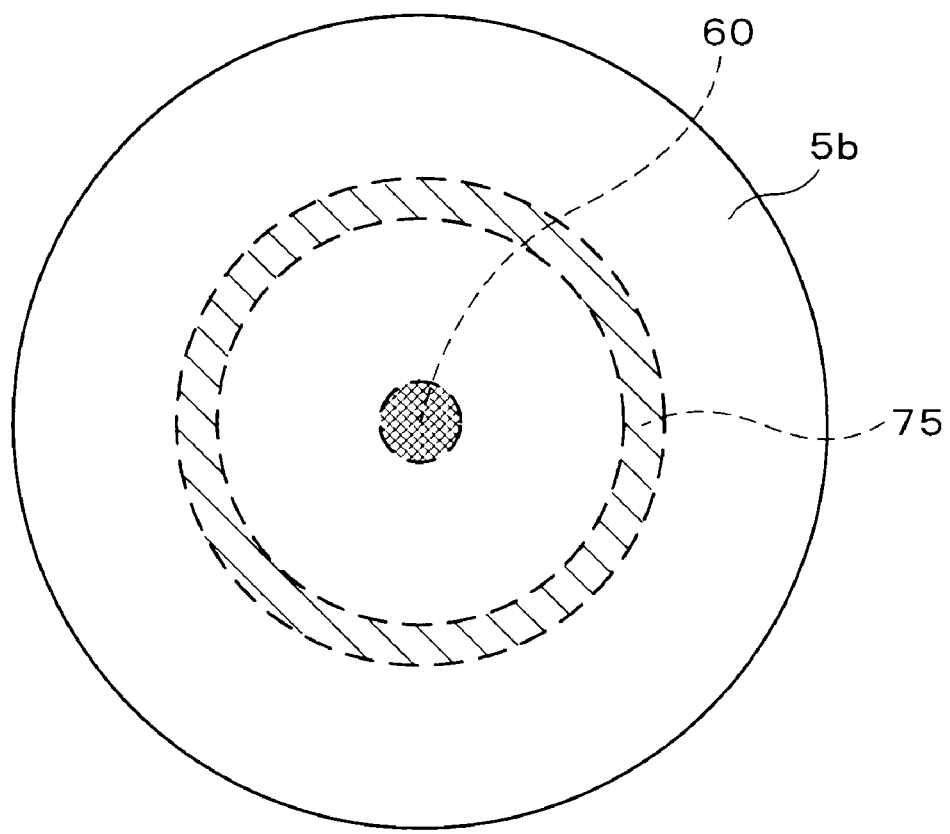
FIG. 7 is a plan view, as seen from above, of a first electrode 60 and a support 75 included in the measuring system 1 according to the second embodiment of the present invention shown in FIG. 6.

FIG. 7 is a plan view, as seen from above, of the first electrode 60 and the support 75 included in a measuring system 1 according to the second embodiment of the present invention shown in FIG. 6. As shown in FIG. 6 and FIG. 7, the first electrode 60 in a disc shape is located in contact with the central portion of the electrostatic chuck 5b (hereinafter, referred to as an object to be measured 5) as the object to be measured 5. In contrast, the annular support 75 is located at the peripheral portion of the object to be measured 5. In the second embodiment of the present invention, the first electrode 60 and the support 75 are concentrically arranged.

The first electrode 60 and the support 75 are connected to the impedance measuring instrument 30, so that a radio frequency can be supplied from one of them to the other to measure the impedance of the object to be measured 5. The impedance measuring instrument 30 can obtain the resistivity from the measured impedance. Note that the frequency of the radio frequency applied for measurement by the impedance measuring instrument 30 is preferably, for example, 100 MHz, 40 MHz, 13.56 MHz, 3.2 MHz or the like that are the same as those applied to the object to be measured 5 when the object to be measured 5 is actually used in the substrate processing apparatus (FIG. 2).

According to the second embodiment, the first electrode 60 is located in contact with a central portion of the object to be measured 5, and the annular support 75 is located around the object to be measured 5 to surround the central portion with which the first electrode 60 is in contact, thus realizing an isotropic path when the radio frequency is supplied between the first electrode 60 and the support 75. This eliminates a bypass of the radio frequency causing a measurement error and allows acquisition of a repeatable measurement value of the impedance and accurate measurement of the resistivity of the object to be measured 5. Further, the second embodiment of the present invention also has the same effect as that of the first embodiment of the present invention.

Figure 8:
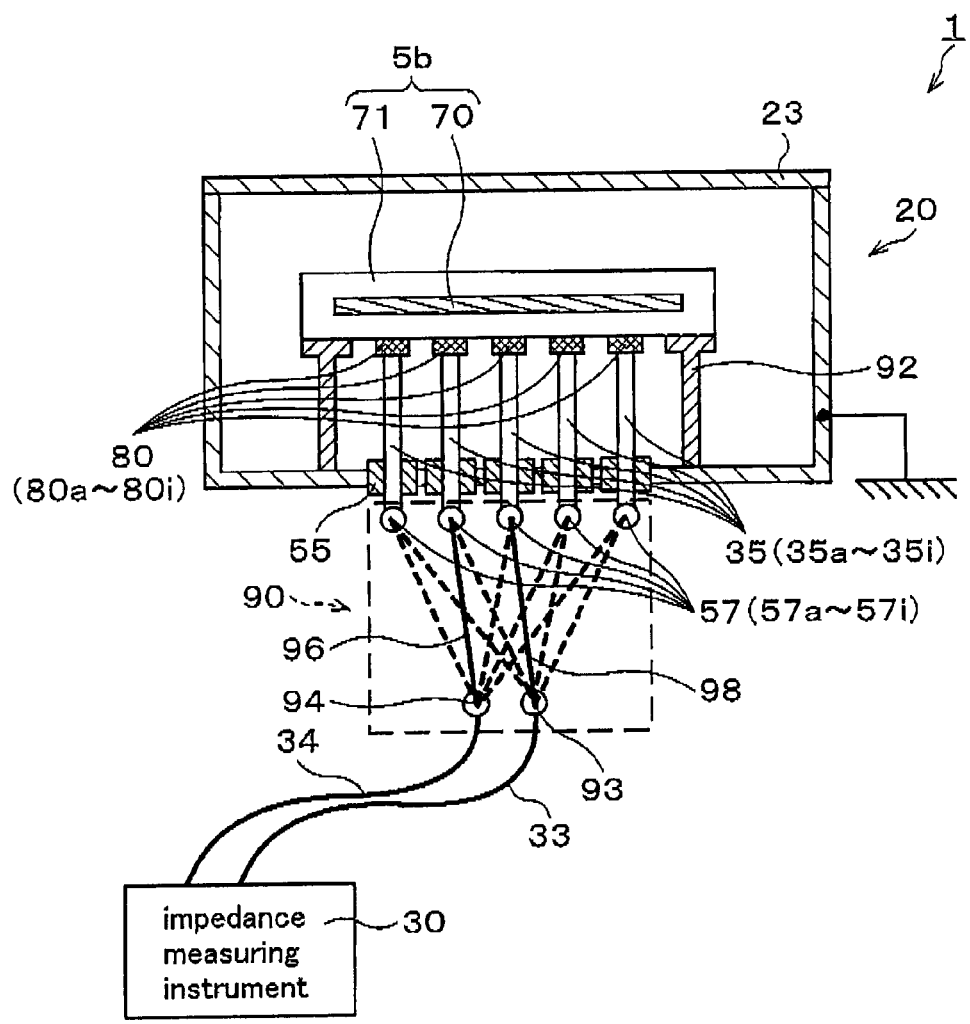
FIG. 8 is a configuration diagram of a measuring system 1 according to a third embodiment of the present invention.

As a third embodiment of the present invention, as shown in FIG. 8, the electrode 25 may be composed of a plurality of (nine in the case shown in FIG. 8) electrodes 80a to 80i, and in measuring the impedance , a switch 90 is used to switch between the plurality of electrodes for measurement so that only electrodes selected from among the plurality of electrodes (for example, 80b and 80c in the case shown in FIG. 8) are connected to the impedance measuring instrument 30. In the third embodiment of the present invention, the resistivity of the electrostatic chuck 5b (hereinafter, referred to as an object to be measured 5) as the object to be measured 5 is measured as in the second embodiment. Further, the object to be measured 5 is supported by an annular support table 92 provided on the inner bottom surface of the casing 20 with a surface of the object to be measured 5 being horizontally kept as in the second embodiment of the present invention, but this support table 92 is made of resin. Note that the casing 20 is grounded as in FIG. 1.

Figure 9:
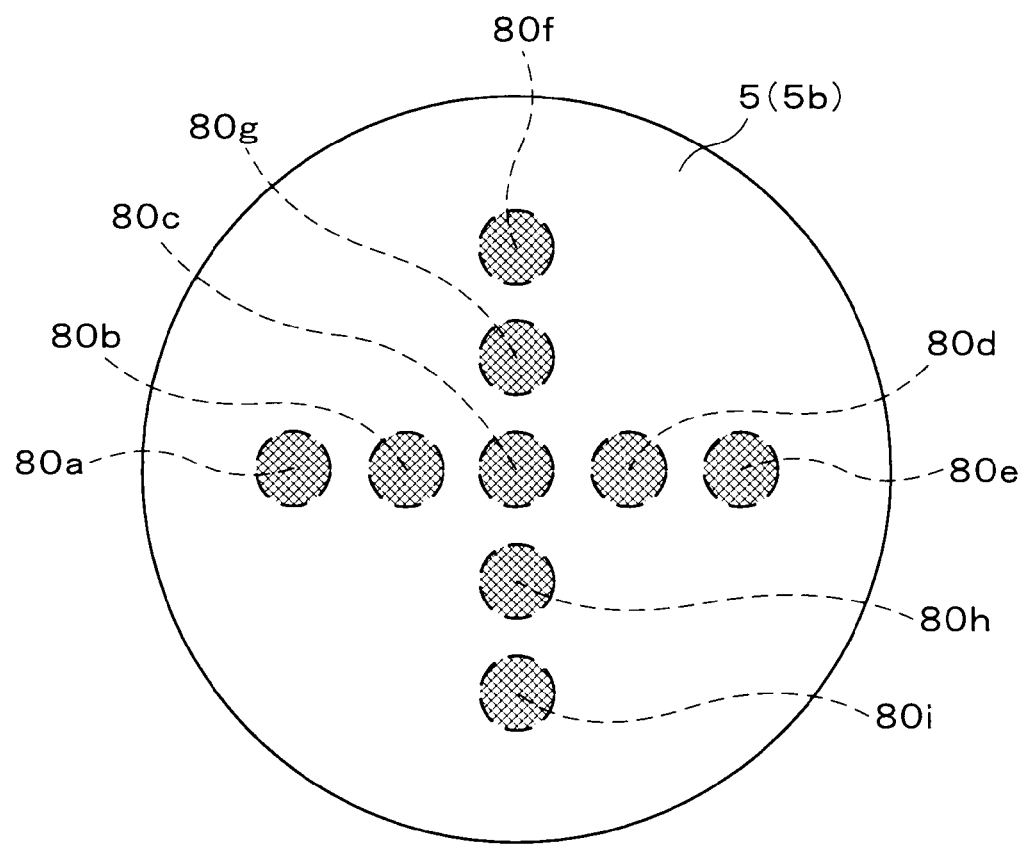
FIG. 9 is a plan view, as seen from above, of nine electrodes 80a to 80i included in the measuring system 1 according to the third embodiment of the present invention shown in FIG. 8.

FIG. 9 is a plan view, as seen from above, of the nine electrodes 80a to 80i included in the measuring system 1 according to the third embodiment of the present invention shown in FIG. 8. Although a case in which the number of switchable electrodes included in the measuring system 1 is nine will be described below, the measuring system 1 may include any number of switchable electrodes. As shown in FIG. 8 and FIG. 9, these nine electrodes 80a to 80i are each formed in a disc shape having almost the same size. Further, as shown in FIG. 9, the nine electrodes 80a to 80i are arranged at respective positions on the object to be measured 5 to form a cross as a whole. As shown in FIG. 8, power supply rods 35a to 35i are connected to the nine electrodes 80a to 80i, respectively. These power supply rods 35a to 35i penetrate the bottom surface of the casing 20 and extend to the outside of the casing 20. Between the power supply rods 35a to 35i and the casing 20, insulating bodies 55 such as Teflon are provided respectively so that the power supply rods 35a to 35i are electrically insulated from the casing 20. Further, at respective end portions of the power supply rods 35a to 35i located outside the casing 20, terminals 57 (57a to 57i) are provided, respectively.

The switch 90 is configured to be able to select, as shown in FIG. 8, arbitrarily two of the terminals 57a to 57i of the above-described power supply rods 35a to 35i and connect them to terminals 93 and 94 connected to the impedance measuring instrument 30 via conductive wires 33 and 34. In the third embodiment of the present invention, conductive wires 96 and 98 whose connection destinations can be changed are connected to the terminals 93 and 94, and male plugs are provided at tips of the conductive wires 96 and 98. Further, female plugs are provided at the terminals 57a to 57i of the power supply rods 35a to 35i. This makes it possible that the male plugs at the tips of the conductive wires 96 and 98 are detached from the terminals 57a to 57i to which the male plugs are connected and inserted into other terminals, whereby the connection can be switched between them as shown in FIG. 8. This can switch the two connection destinations of the impedance measuring instrument 30 to two terminals which are arbitrarily selected from among the terminals 57a to 57i to thereby switch between the electrodes 80a to 80i to be connected to the impedance measuring instrument 30, whereby the measurement location of the object to be measured 5 for which the impedance is measured can be changed.

To concretely explain it, when measurement is performed with the terminal 93 being connected to the terminal 57a and the terminal 94 being connected to the terminal 57e using the switch 90, the measurement location of the object to be measured 5 is set between the electrode 80a and the electrode 80e shown in FIG. 9, and the impedance of the object to be measured 5 can be measured. In this case, the impedance of the measurement location having a length close to the diameter of the object to be measured 5 is measured so that the resistivity at the measurement location can be measured. On the other hand, when the terminal 93 is connected to the terminal 57b and the terminal 94 is connected to the terminal 57c using the switch 90, the measurement location of the object to be measured 5 is set between the electrode 80b and the electrode 80c shown in FIG. 9, and the impedance of a measurement location having a very small distance is measured for the object to be measured 5 so that its resistivity can be measured.

According to the above third embodiment, the plurality of electrodes 80a to 80i are located on the object to be measured 5, and two electrodes to be connected to the impedance measuring instrument 30 are selected from among the plurality of electrodes the thereby switch the electrodes so that the impedance of the object to be measured 5 is measured, thereby enabling measurement of the impedance of any measurement location of the object to be measured 5 to obtain its resistivity. Further, it becomes possible to variously change the position and the size of the measurement location when measuring the resistivity. This makes it possible to check whether the physical properties such as the resistivity and the like of the object to be measured 5 which are obtained from the measured impedance fall within predetermined ranges over the entire object to be measured 5.

Figure 10:
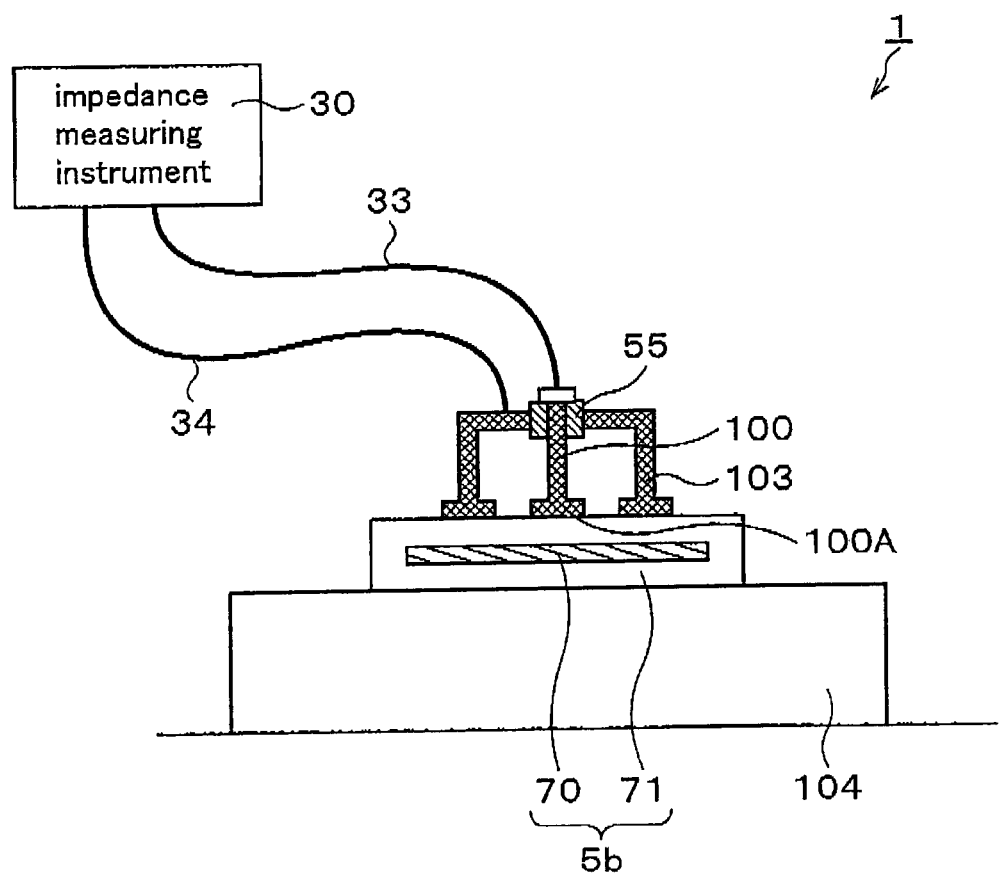
FIG. 10 is a configuration diagram of a measuring system 1 according to a fourth embodiment of the present invention.

As a fourth embodiment of the present invention, as shown in FIG. 10, an object to be measured 5 may be mounted on a table 104 made of resin and subjected to measurement from above using a jig composed of a first electrode 100 and the like. In this embodiment, a tip portion 100A of the first electrode 100 located in contact with the object to be measured 5 is configured such that the periphery of the tip portion 100A is covered by a second electrode 103 located in contact with the peripheral portion of the object to be measured 5 and the object to be measured 5. In the fourth embodiment of the present invention, the second electrode 103 is formed in a cylindrical shape using, for example, Al (aluminum) and C (carbon) as a material, and is located such that its axial direction is parallel to the vertical direction. The second electrode 103 has an open circular lower surface on the side where it is brought into contact with the object to be measured 5 and a closed circular upper surface. Thus, a closed space is formed in a shape such that the lower portion of the opened lower surface of the second electrode 103 is closed by the object to be measured 5. The first electrode 100 is configured to penetrate in the vertical direction the middle portion of the circular upper surface of the second electrode 103, and the first electrode Is 100 in contact with the object to be measured 5 is located in this closed space. Note that though a case in which the casing 20 is not used as shown in FIG. 10 is described in the fourth embodiment of the present invention, the casing 20 may be used as in the second embodiment shown in FIG. 6.

The first electrode 100 and the second electrode 103 shown in FIG. 10 are connected to the impedance measuring instrument 30 similarly to the first electrode 60 and the support 75 shown in FIG. 6.

According to the above fourth embodiment, since the measurement location of the surface of the object to be measured 5 on the side where the first electrode 100 and the second electrode 130 are arranged is completely covered by the second electrode 103 when the impedance of the object to be measured 5 is measured by flowing a radio frequency between the first electrode 100 and the second electrode 103, the influence due to mixing ambient noise when measuring the impedance can be reduced more than in the case where the measurement is performed using a conventionally-known measuring technique of performing measurement with the measurement location of the object to be measured 5 being opened. This allows the impedance to be more accurately measured.

Preferred embodiments of the present invention have been described above with reference to the accompanying drawings, but the present invention is not limited to the embodiments. It should be understood that various changes and modifications are readily apparent to those skilled in the art within the scope of the technical spirit as set forth in claims, and those should also be covered by the technical scope of the present invention.

Although the cases in which the object to be measured is the chamber internal part 5 composed of an almost cylindrical insulating body, the electrostatic chuck 5b having a structure composed of a conductor covered by a dielectric, or the like have been described in the above embodiments, the object to be measured may be made in any shape and made of any material.

Although the cases in which the value of the dielectric loss tangent or the resistivity is measured as the physical property of the object to be measured based on the measured impedance have been described in the above embodiments, any physical property of the object to be measured may be obtained from the measured impedance.

Although the cases where the electrode 25 is in contact with the object to be measured 5 from below the object to be measured 5 have been described in the above embodiments, the electrode 25 may have any configuration such that it is in contact with the object to be measured 5 from above the object to be measured 5 or the like.

Although the case in which the plurality of electrodes 80a to 80i are fixed to predetermined measurement positions of the object to be measured 5 has been described in the above embodiment, the plurality of electrodes 80a to 80i may be made movable on the object to be measured 5 so that the respective positions can be set at any positions.

Although the case in which the support 75 located at the peripheral portion of the object to be measured 5 is concentrically located with the first electrode 60 located at the central portion of the object to be measured 5 has been described in the above embodiment, the first electrode 60 and the support 75 may have any configuration as long as the support 75 is located around the first electrode 60.

Although the case in which the switch 90 switches between the plurality of electrodes 80a to 80i such that only two selected electrodes of them are connected to the impedance measuring instrument 30 has been described in the above embodiment, any number of electrodes may be switched for connection to the impedance measuring instrument 30. Further, though the case in which the switch 90 is configured to switch the connection by changing the connection destinations of the conductive wires 96 and 98 has been described, the switch 90 may have other configurations.

What is claimed is:

1. A measuring system measuring an impedance of an object to be measured, comprising:
    an impedance measuring instrument that measures a dielectric loss tangent or resistivity of the object from a value of the measured impedance;
    a casing formed of a grounded conductor having the object to be measured therein that blocks noise due to influence by surroundings; and
    a radially-shaped electrode connected to said impedance measuring instrument and the object to be measured.

2. The measuring system as set forth in claim 1, wherein the object to be measured is a chamber internal part composed of an insulator in a semiconductor processing apparatus.

3. The measuring system as set forth in claim 1, wherein the object to be measured is a conductor covered by a dielectric in a semiconductor processing apparatus.

4. A measuring system measuring an impedance of an object to be measured, comprising:
    an impedance measuring instrument that measures a dielectric loss tangent or resistivity of the object from a value of the measured impedance;
    a casing formed of a grounded conductor having the object to be measured therein that blocks noise due to influence by surroundings;
    a plurality of electrodes connected to said impedance measuring instrument and to the object to be measured; and
    a switch that switches such that only selected electrodes of said plurality of electrodes are connected to said impedance measuring instrument.

5. The measuring system as set forth in claim 4, wherein the object to be measured is a conductor covered by a dielectric in a semiconductor processing apparatus.

6. A measuring system measuring an impedance of an object to be measured, comprising:
    an impedance measuring instrument; and
    a first and a second electrode connected to said impedance measuring instrument and connected to the object to be measured,
    said second electrode being configured in an annular shape to cover said first electrode, the second electrode having an open circular lower surface on a side where said second electrode is brought into contact with the object to be measured and a closed circular upper surface,
    wherein a measurement location of a surface of the object to be measured on a side where said first electrode and said second electrode are arranged is completely covered by said second electrode.

* * * * *